United States Patent
Ara et al.

(10) Patent No.: US 6,654,935 B2
(45) Date of Patent: Nov. 25, 2003

(54) IP VALIDATION METHOD AND IP VERIFIED BY THE IP VALIDATION METHOD

(75) Inventors: Koji Ara, Kodaira (JP); Kei Suzuki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/162,061

(22) Filed: Jun. 5, 2002

(65) Prior Publication Data

US 2003/0018888 A1 Jan. 23, 2003

(30) Foreign Application Priority Data

Jul. 19, 2001 (JP) ........................................ 2001-219814

(51) Int. Cl.[7] .............................................. G06F 17/50
(52) U.S. Cl. .................................. 716/4; 716/5; 716/16
(58) Field of Search .............................. 176/4–5, 16–18; 703/14–15

(56) References Cited

U.S. PATENT DOCUMENTS 6,141,630 A * 10/2000 McNamara et al. ............ 703/14
6,446,243 B1 * 9/2002 Huang et al. ................... 716/4
6,493,852 B1 * 12/2002 Narain et al. .................. 716/5
6,536,031 B2 * 3/2003 Ito et al. ...................... 716/18

OTHER PUBLICATIONS

K. Suzuki et al., "OwL: An Interface description Language for IP Reuse", IEEE 1999 Custom Integrated Circuits Conference, pp. 403–406.

"Taxonomy of Functional Verification For Virtual Component Development and Integration", Version 1.1, Virtual Socket Interface Alliance, Jan. 2001.

* cited by examiner

Primary Examiner—Matthew Smith
Assistant Examiner—Paul Dinh
(74) Attorney, Agent, or Firm—Miles & Stockbridge P.C.

(57) ABSTRACT

According to the disclosed invention, an index for evaluating an IP objectively and quantitatively is set so that users will refer to the index as the criterion for looking for an IP providing user-desired function. IP vendors prepare a higher-level index of verification range that is separated into infinite degrees than the existing indexes of verification range such as hardware source code coverage and path coverage. According to this index, what extent or degree to which IP functionality has been verified is determined. The thus determined degree of verification is expressed by a validation level that is added to IP information to be provided to users.

7 Claims, 10 Drawing Sheets

IP VALIDATION METHOD AND IP VERIFIED BY THE IP VALIDATION METHOD

FIELD OF THE INVENTION

The present invention relates to LSI design assets (intellectual properties) for building a system-scale LSI and management thereof.

BACKGROUND OF THE INVENTION

Enhanced LSI packaging technology for integration has made it possible to mount most of the elements required for building a system on one semiconductor chip.

When designing such a system-scale LSI, system designers may utilize circuit modules that have previously been designed within and possessed by the company and the like they belong to as the company's intellectual assets or those purchased from an external supplier. These design assets are called Intellectual Properties (IPs).

Nowadays, such IPs are supplied from IP developers (vendors) to IP users via diverse distribution channels. For example, some IP vendor companies render a line of their proprietary IP articles open to the public on their Web site. Alternatively, some IP broker such as Virtual Component Exchange (VC) and IPTC Corporation manage the locations of IP articles of a plurality of IP vendors and render them open to the public.

Generally, IP articles of trade are sold as a combination of design data and documentation. Design data of IP includes hardware descriptions of the product implementation of the IP, its operation model, simulation test bench, expected values of simulation, etc. Its Documentation includes outside-usage specifications for IP user, verification procedural descriptions, restrictions for use, design records, bug check lists, etc.

In general, simulation is used as means for checking to see whether designers built the IP implementation product correctly. A variety of patterns of simulation runs check for operation that does not conform to the specifications. It is ideal to prepare as many simulation patterns as for all specifications (regarding the values of signals). Because of a huge quantity of combinations of specifications (regarding the values of signals), testing all cases is not practicable. Consequently, as one of the means for measuring variation in simulation, an index such as source code coverage for HDL code is used. In a publication "Taxonomy of Functional Verification For Virtual Component Development and Integration Version 1.1" of the Virtual Socket Interface Alliance (VSIA), the organization for standardizing IPs in the USA, hardware source code coverage and functional coverage are described as verification metrics.

In a broad sense, the function of source code coverage is such that it regards one of possible states on a state machine, signal toggle, branch-to-instruction by conditional branch, etc. as one unit, supervises the simulation run for whether it executed each unit, and counts up all units executed at the end of simulation.

As an example, the coverage for conditional branches is illustrated below. Assume that the following source code is written. Here A and B are conditional expressions, and if condition is true, THEN is executed; if false, ELSE is executed.

```
{
if (A) {THEN-A}
else {ELSE-A}
if (B) {ELSE-B}
else {ELSE-B}
}
```

To execute all THEN and ELSE statements once, it is sufficient to execute the above source code twice. For example, execute THEN-A and THEN-B statements in the first time execution, and execute ELSE-A and ELSE-B statements in the second time execution. However, two cases other than the above are possible in this source code; that is, a combination of THEN-A and ELSE-B and a combination of THEN-B and ELSE-A. If bugs exist in these combinations of statements, they cannot be detected by the source code coverage for conditional branches.

Through consideration of the above circumstances, the source code coverage is expanded to a path coverage that is upgraded source code coverage. For a sequence of if statements and case statements as illustrated above, the path coverage additionally takes what path (combination) in which statements have been executed into account. In this respect, the path coverage is functionally superior to the above-illustrated source code coverage for conditional branches.

A general procedure in which an IP user purchases an IP article from an IP vendor is as will be described below.

The IP vendor designs and verifies their proprietary IP implementation product. Concurrently, the IP vendor prepares documentation of the IP product. When the documentation has been completed, information content about the IP (exclusive of the disclosure of the IP product itself), which is free of secrecy problem, is rendered open to the public to interest people in purchasing the IP. On the other hand, an IP user looks for an IP that provides user-desired function (for example, USB interface, MPEG decoder, etc.) via the Internet or the like. The IP user searches the Web sites of IP vendors and IP brokers for desired IP. The user may select from several IP candidates for purchase through consideration of performance, cost, risk, and other matters, based on the information obtained prior to agreements that must be made with an IP vendor when buying an IP. The user determines to buy an IP from an IP vendor and makes an agreement with the IP vendor. Then, the IP vendor delivers the IP product and documentation including secret information to the IP user and the IP user pays the money for the IP and licensing to the IP vendor.

Aiming at facilitating circuit module reutilization, Kei Suzuki, et al. attempted to map the values of signals that the input and output pins of a circuit module are to have at a specific time and their sequences over time in implementing the functions of the module; reference "OwL: An Interface Description Language for IP Reuse" pp. 403–406. Circuit module operations described in interface specifications, that is, function-specific timing charts and the like are graphically represented on the computer, using a state transition machine. The state machine representation aids in understanding the circuit module specifications. It can be used to verify connection between two circuit modules and build an automatic design process such as synthesizing signal patterns.

The above-described IP distribution flow involves some problems for both IP user and IP vendor.

First, a problem for IP users is posed when they look for an IP providing for user-desired function. Because different IP vendors and IP brokers render different types of information open to the public, there is no firm index dependable in selecting an IP. This problem is explained in terms of IP quality. Some IP vendor provides bug detection curves, another IP vendor provides only check lists. Yet, another IP vendor provides a coverage degree of source code. In this respect, consequently, IP users have difficulty in determining what IP is the best quality.

Next, a drawback of currently used verification indexes, typically, source code coverage, will be discussed. Source code coverage is, surely, one index for measuring variation in simulation. However, even if the source code coverage is 100%, it does not mean covering all variations of IP product (circuit module) operation. In some case, bugs are revealed only after executing a certain code description by a certain number of times. In some case, bugs are revealed only when statements are executed in specific sequence. With source code coverage, there is a possibility of failure to debug.

Accordingly, the best possible alternative in the present situation is that, in addition to applying 100% of source code coverage, random test patterns are run to debug undetected bugs until debugging reaches a saturation point, but not complete. It is possible that randomly run test patterns detect bugs by chance, however, it is not sufficient for users as an objective index of verifying IP functionality.

On the other hand, IP vendors probably wish they would push their proprietary IPs by explaining distinctive features thereof from other corporate IPs. In view of IP quality, IP vendors wish they would push their IPs in distinction from other corporate ones by asserting that their IPs are higher quality than others. However, a publicly known index of verifying IP functionality is solely source code coverage that is generally used as described above. Applying 100% coverage of source code is minimum requirement and demonstration of IP functions using source code coverage data is not effective for IP vendors to attain their purpose to make their own IPs distinct from other corporate ones.

The above is also true even if the path coverage that is upgraded source code coverage is used. No doubt, the path coverage is better in considering combinations of statements and more simulation patterns need to run. However, there is still a possibility of failure to debug for cases where bugs can be detected only after executing a combination of statements by a certain number of times or more.

All the above-described problems are due to using simulation for verifying IP functionality. For specifications of a circuit module of IP, the number of times of possible execution of simulation is variable and infinite. Thus, an infinite number of combinations of simulation patterns occur. As indexes (metrics) of verifying that the model conforms to the specifications, however, there are only a few ones such as source code coverage and path coverage. If these indexes are satisfied (reaching coverage of 100%), there are no indexes of verification in more depth. Thus, IP users have difficulty in determining which IP is better when comparing IPs and IP vendors have difficulty in pushing their own IPs in distinction from other competitive corporate IPs.

SUMMARY OF THE INVENTION

In addition to the existing indexes of verification range such as hardware source code coverage and path coverage, the present invention provides a higher-level index of verification range with infinite degrees. According to this index, what extent or degree to which IP functionality has been verified is determined. The thus determined degree of verification is expressed by a validation level that is added to IP information to ensure the reliability of the verified functionality of the IP.

DETAILED DESCRIPTION OF THE PREFERRED EMBODIMENTS

The present invention now is described fully hereinafter with reference to the accompanying drawings in which preferred embodiments thereof are shown.

Figure 1:
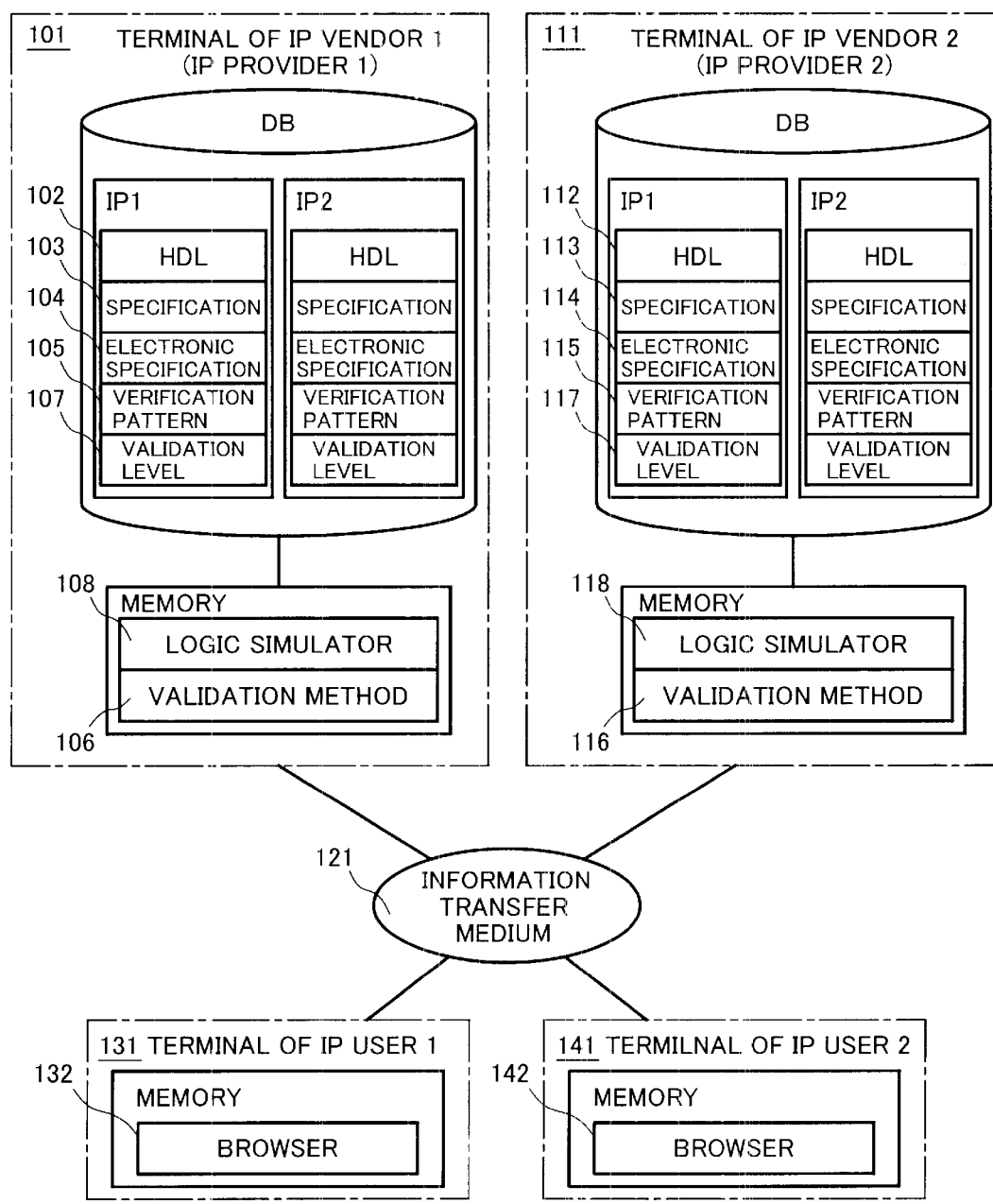
FIG. 1 is a schematic diagram for explaining a preferred embodiment of the present invention.

FIG. 1 is a schematic diagram for explaining a preferred embodiment of the present invention. IP vendors' terminals 101 and 111 and IP users' terminals 131 and 141 are connected via an information transfer medium 121 such as the Internet, a wireless communication channel, etc. Information is also distributed by a record carrier medium such as a floppy disk that is embraced in the above information transfer medium. Noting the IP vendor's terminal 101, hardware descriptions (HDL) 102 of IP for IP1 and IP2 to be distributed to users are created and stored into its database DB. Outside-usage specifications for IP user 103 are also stored in the DB. Simulation patterns 105 for verifying IP functionality are prepared. Files of electronic specifications 104 are created into which specifications data generated in normalized or graphic representation are stored. Specifications data is generated for a verification level determined for validation level information 107 to be provided to a user. Upon the preparation of the above contents of the DB, a logic simulator 108 and a validation method (validation level determination program) 106 are activated to run on the memory. Hardware descriptions (HDL) 102 and electronic specifications 104 are input to the logic simulator 108. Electronic specifications 104 are input to the validation level determination program 106. Using the logic simulator 108 and the validation level determination program 106, validation level information 107 is generated. Generating the validation level information 107 will be described later.

On the IP vendor's terminal 111, necessary data and information 112–117 for IP1 and IP2 to be distributed to users are generated and stored into its database DB as is the case for the IP vendor's terminal 101. Then, a logic simulator 118 and a validation method (validation level determination program) 116 are activated to run on the memory. These entities are the same as those on the IP vendor's terminal 101, and therefore further explanation thereof is not repeated.

On the IP user's terminal 131, when looking for a user-desired IP from an IP vendor, the user uses a browser 132 for the Internet operating on the memory and looks up the validation level information 107 for IP provided by the IP vendor 101 or the IP vendor 111 via the information transfer medium 121. The IP user can check validation level information 107 for IP released on the IP vendor's terminal 101 and then check another validation level information 117 for IP released by another vendor, for example, IP vendor 111. In this way, the user obtains validation level information in addition to outside-usage specifications, catalogs, and price for several candidates for the user-desired IP. Through this process of obtaining information, the user eventually determines an IP to get.

On the IP user's terminal 141, similarly, the user looks for a user-desired IP from an IP vendor's terminal.

Figure 2:
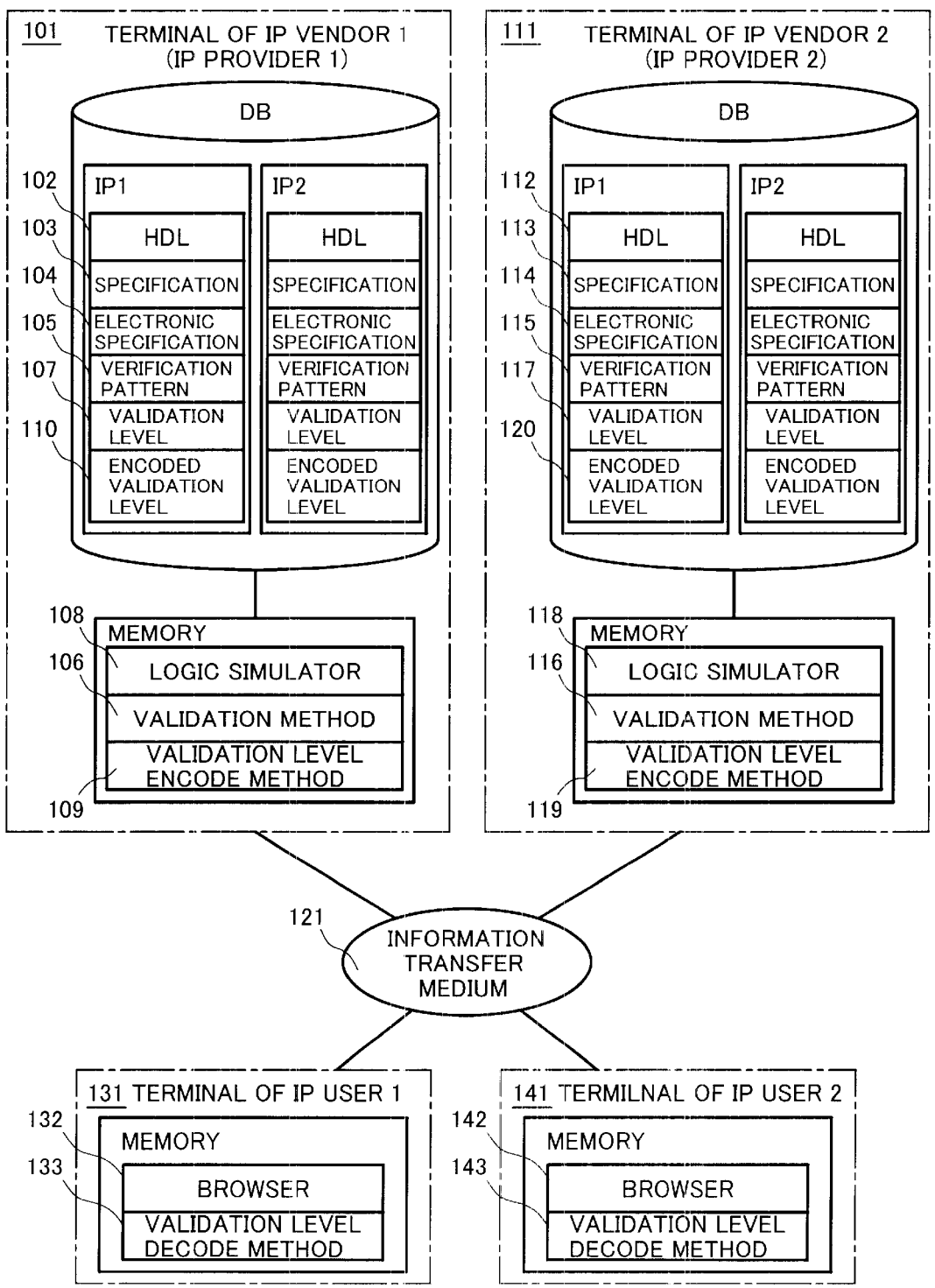
FIG. 2 is a schematic diagram for explaining the preferred embodiment of the invention in which additional information is provided for confirming that validation level information is true.

FIG. 2 shows the preferred embodiment wherein encrypted validation level information 110, 120 is provided as additional information that is used for confirming that validation level information 107, 117 described in FIG. 1 is true. The encrypted validation level information is generated by a validation level encrypting program 109, 119 after the validation level information 107, 117 is generated. This encrypted validation level information 110, 120 is used as the key for proving that the validation level information 107, 117 generated in the above-described process is certainly true.

First, on the IP vendor's terminal 101, encrypted validation level information 110 is generated and provided or released to an IP user with validation level 107. The user can confirm whether the obtained validation information 107 is reliable by using a validation level decrypting program 133. The validation level decrypting program 133 is distributed beforehand from the IP vendor to the IP user by request. To the validation level decrypting program 133, validation level information 107 and encrypted validation level information 110 are input. The validation level information 107 and encrypted validation level information 110 are transferred via the information transfer medium 121 to the IP user's terminal 131 and stored there before decryption processing is performed. The validation level decrypting program 133 decrypts the encoded validation level information 110 and ensures that the validation level information 107 is true, or in other words, it is not tampered with. After ensuring the true validation level, the program outputs it to the user.

The above encryption is also performed on the IP vendor's terminal 111 in the same way as for the IP vendor's terminal 101; explanation thereof is not repeated. The above decryption processing is also performed on the IP user's terminal 141 in the same as for the IP user's terminal 131: explanation thereof is not repeated.

Figure 3:
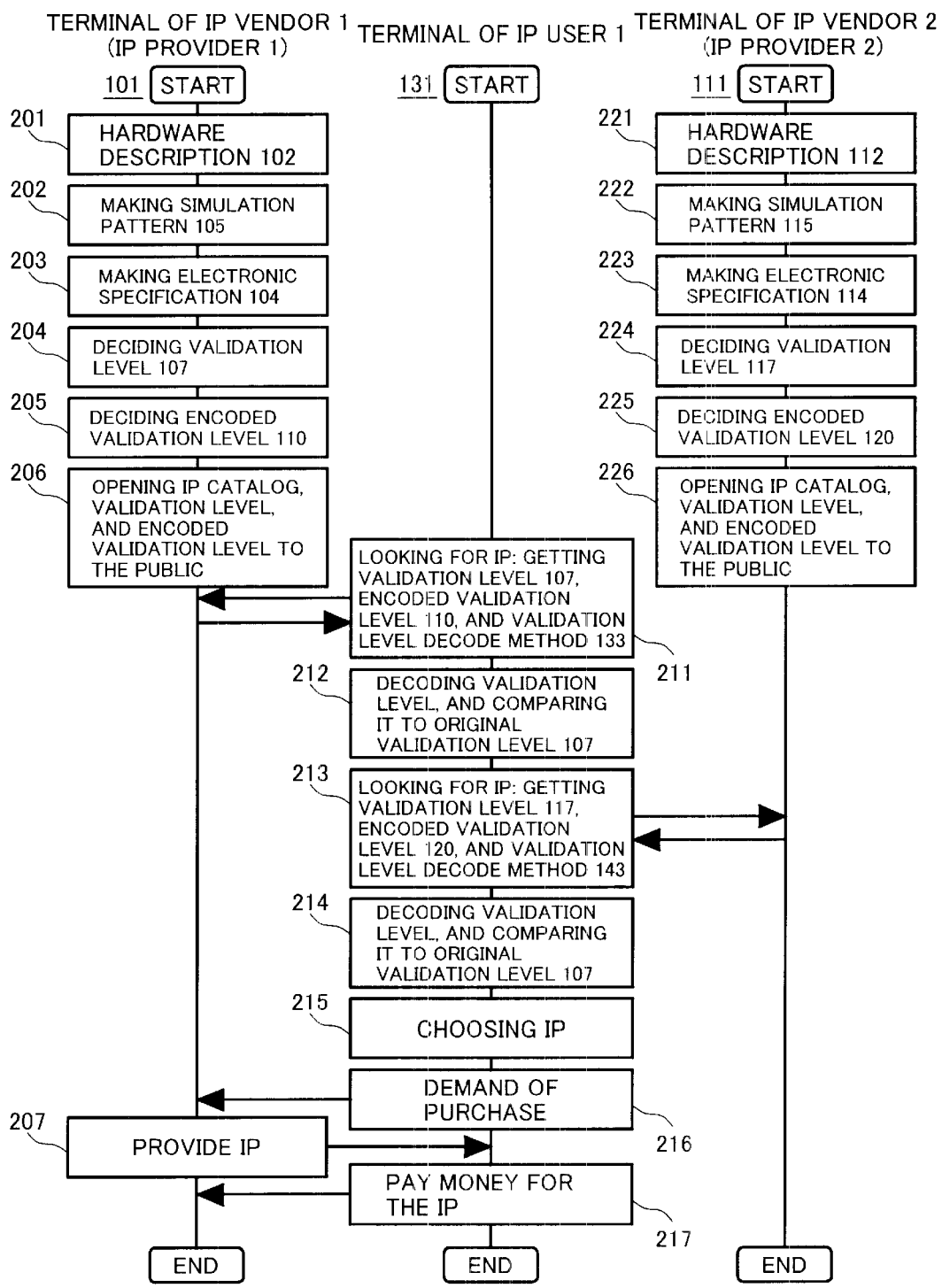
FIG. 3 is a diagram representing an information flow between IP vendors' terminals and an IP user's terminal when the present invention is implemented.

Based on the above description of the preferred embodiment, using FIGS. 1 and 2, FIG. 3 schematically represents the time-sequence flow of an illustrative process in which IP vendors' terminals 101 and 111 provide IP information that is received by an IP user's terminal 131 and the user selects an IP, assuming that time elapses from the top to down.

On the IP vendor's terminal 101, generating hardware descriptions 102 (step 201), generating simulation patterns 105 (step 202), creating electronic specifications 104 files (step 203), determining a validation level 107 (step 204), encrypting the validation level 110 (step 205) are performed for an IP. Then, the IP catalog, validation level 107, and encrypted validation level 110 are released (step 206). The above steps 201 to 203 may be in different sequence than specified.

On the IP vendor's terminal 111, the steps corresponding to the above steps are executed and, finally, IP catalog, validation level, and encrypted validation level are released (step 226).

Then, the user operating the IP user's terminal 131 looks for a user-desired IP. Assume that the user first looks in the information provided by the IP vendor 101. The user accesses the IP vendor's terminal 101 via the information transfer medium 121 and looks through the IP catalog, validation level, and encrypted validation level released in the step 206. If this IP provides functions that the user wants, a step of confirming whether the validation level obtainable from the vendor is reliable is performed. Prior to confirmation, the validation level 107 and encrypted validation level 110 transferred from the IP vendor's terminal 101 and the validation level decrypting program 133 are stored into the IP user's terminal 131 (step 211). Then, the confirmation step is executed, using the validation level decrypting program 133 (step 212). In the confirmation step 212, the validation level 107 and encrypted validation level 110 are input to the program. The validation level decrypting program 133 first decrypts the encrypted validation level 110. The program then compares the thus decrypted level with the validation level 107 for matching and returns the result of the comparison to the user. After confirming that the validation level 107 is true, the user looks in the information for another IP provided by another IP vendor, for example, the IP vendor 111 (step 213). By following the same procedure, eventually, the user confirms that the validation level of the second IP is true (step 214).

After looking in the provided IP information and confirming that the validation level of IP is true for candidate IPs provided by a plurality of IP vendors, the user selects an IP to buy through consideration of cost and performance of the IPs and their validation level that indicates a degree of verification of IP functionality (step 215). If the user determined to buy the IP provided by the IP vendor 101, a request for the purchase of the IP is issued from the IP user's terminal to the IP vendor's terminal 101 (step 216). After receiving the request for the purchase from the user, the IP vendor 101 makes a regular agreement with the user and distributes the IP to the user (step 207). After getting the IP, the IP user pays the money for the IP and licensing to the IP vendor (step 217).

In this way, a sequence of steps from building a module design of IP by IP vendor to buying the IP by IP user can be executed in a time-sequence flow via the information transfer medium 121. While two IP vendors are involved in this illustrative process flow, this process flow is indisputably applicable to other cases where one vendor or three or more vendors are involved. If encrypting a verification level is not applied, the steps 205 and 225 are not necessary. In this case, the information to be provided in the steps 206 and 226 and received in the steps 211 and 213 does not include encrypted validation level; however, this is no departure from the concept or spirit of the present invention.

Figure 4:
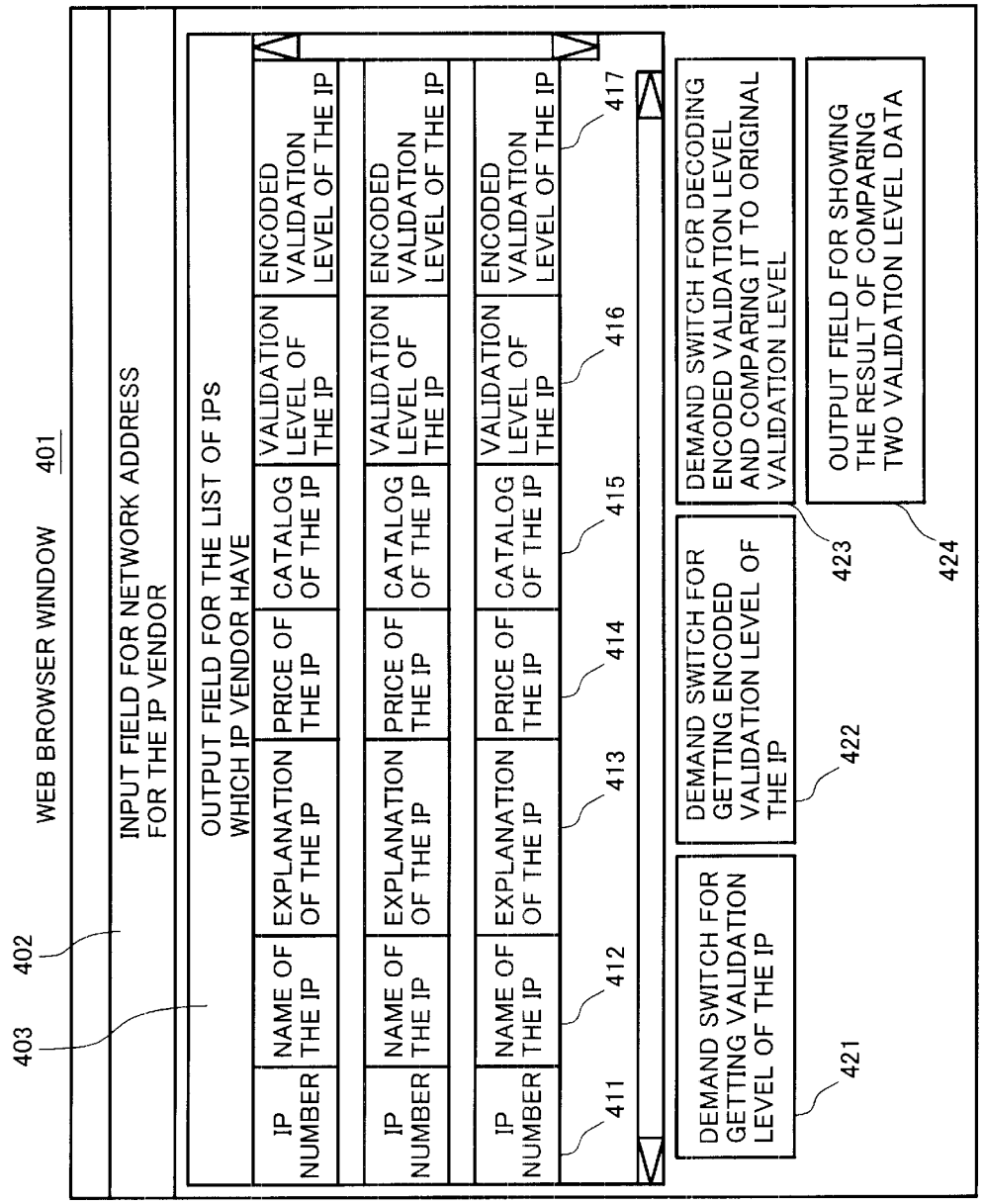
FIG. 4 illustrates an exemplary window displayed by the browser on the screen of an IP user's terminal when the present invention is implemented.

FIG. 4 illustrates an exemplary structure of a window for selecting IP for purchase, displayed on the screen of the IP user's terminal 131 included in FIGS. 1 and 2. The Web browser outputs the window 401 to the display of the user's terminal 131. By entering the address on the Internet of an IP vendor of preference, for example, the IP vendor 101, in the input field 402 for network address of IP vendor, the user can have a Web page listing IPs possessed and provided by the IP vendor 101 displayed in the viewing area 403. The Web page displayed in the viewing area 403 contains IP identifier number 411, IP name 412, IP function explanation 413, IP price 414, IP catalog 415, validation level of IP 416, and encrypted validation level of IP 417 for each IP. The above items as many as the number of IPs possessed and provided by the IP vendor 101 and arranged on the page. The items for all IPs cannot be shown on one display page, the user can view them by scrolling.

For each IP displayed on this window, to confirm that the validation level of IP is true, or is not tampered with, the user must carry out the following procedure. Click the request switch to get validation level of IP 421 and the request switch to get encrypted validation level of IP 422 and turn them on. Then, the validation level of IP 416 and encrypted validation level of IP 417 are transferred and stored into the user's terminal 101. Next, click the request switch to confirm whether the validation level of IP is true to turn it on. Then, the validation level decrypting program 133 starts to run, decrypts the encrypted validation level of IP 417, and compares the thus decrypted level with the validation level of IP 416. The result of this comparison is output in the output filed for the result of comparison confirming whether the validation level of IP is true 424. This output result is a message allowing the user to determine whether the validation level of IP is true, for example, such as a simple word "valid" or "invalid." Once having recognized that the validation level 416 is true, the user can regard the IP as one candidate for purchase.

Figure 5:
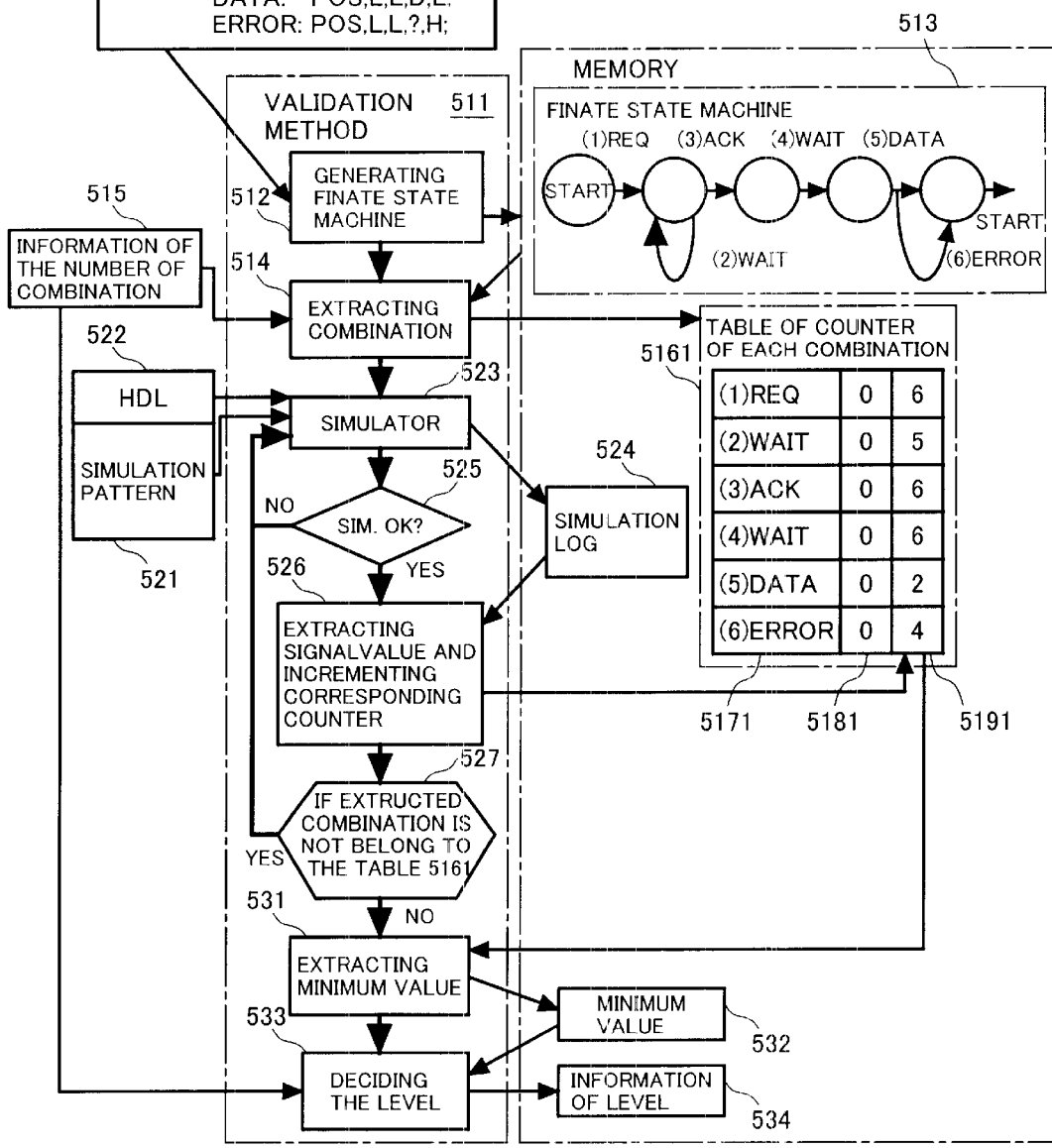
FIG. 5 is a flowchart illustrating an exemplary process flow of simulation-base method implementation of the present invention.
Figure 6:
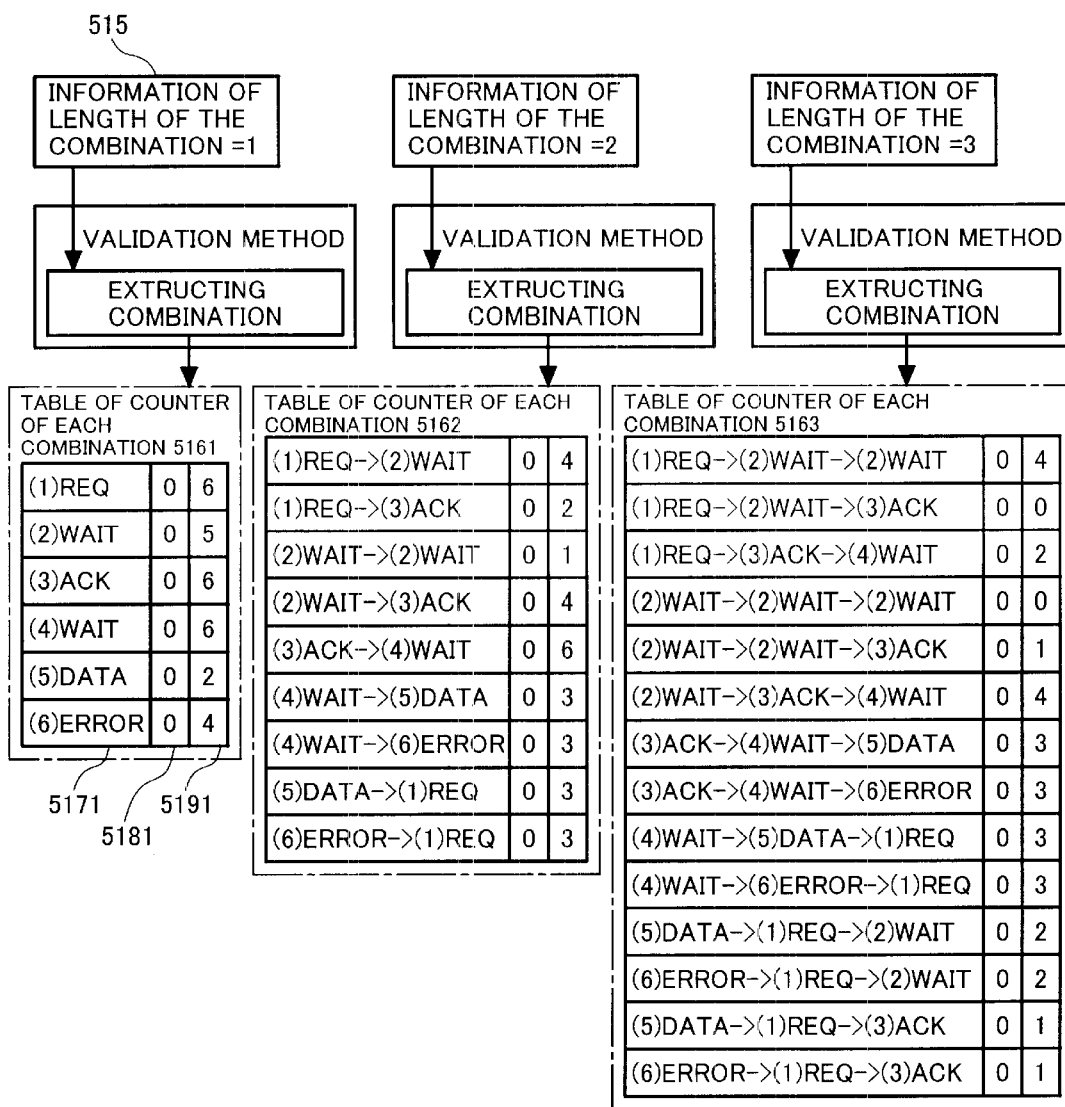
FIG. 6 illustrates exemplary combinations of signals counters that are used in a step for extracting combinations of functional signals, wherein the counters differ for different values of parameter, the number of signals in combination included in FIG. 5.

With reference to FIGS. 5 and 6, an illustrative procedure of generating validation level 107 information, using the logic simulator 108 and validation level determination program 106, which are shown in FIGS. 1 and 2, will now be explained. FIG. 6 illustrates exemplary combinations of signals counters that are used in a step for extracting combinations of functional signals. These counters differ for different values of parameter, the number of signals in combination, which is included in FIG. 5.

The validation level determination program 511 on a simulation base generates a state machine 513 from the electronic specifications 104, using a graph-generating program (step for generating a state machine 512). The state machine is normalized or graphic representation of the specifications. A combination of values of signals appearing at all pins at a sampling time or one function of the IP is associated with a branch in the state machine 513. In the following, examples regarding the former combination of values of signals will be discussed; however, this is also applicable to a case where branches are regarded as the functions of IP. In the following explanation, assume that sampling is synchronized with the rising edge of a clock signal.

Using a combinations extracting program, all possible combinations of functional signals to change by the number of a chain of signals equaling to the number assigned to parameter, the number of signals in combination 515 are generated from the state machine 513, and a combinations of signals counter for the above combinations is generated (step for extracting combinations 514). If, for example, "1" is assigned to parameter, the number of signals in combination 515; a combinations of signals counter 5161 is generated. In the combinations of signals counter 5161, all possible combinations of functional signals that change by the number of a chain of signals that is one in this case, that is, no change occurs in the state machine 513 are stored in entry fields of combinations 5171. In the exemplary state machine shown in FIG. 5, the following six functional signals may occur that do not change because the number of a chain of signals is one: (1) req, (2) wait, (3) ack, (4) wait, (5) data, and (6) error. The combinations of signals counter further includes the fields to contain the count of appearance of each combination, indicating the number of times the combination has been detected. For example, the combinations of signals counter 5161 includes initial combination appearance count fields 5181 and combination appearance count fields 5191. The combination appearance count fields 5191 contain a count value, that is, the number of times the combination has appeared.

As shown in FIG. 6, if "2" is assigned to parameter, the number of signals in combination 515, all possible combinations of functional signals to change in a chain of two signals are extracted from the state machine 513 and stored into a combinations of signals counter 5162 as shown. The counter retains the combinations of signals and their appearance count values. This is common no matter what number is assigned to parameter, the number of signals in combination 515. Accordingly, if "3" is assigned to parameter, the number of signals in combination 515; a combinations of signals counter 5163 is generated. This mechanism can commonly be used even when "4" or a larger number is assigned to parameter, the number of signals in combination 515.

After generating the combinations of signals counters, the logic simulator 523 is executed, based on information, logic circuit data 522 described in hardware description language (HDL) or the like and simulation patterns 521 that are sequences of input/output signals to/from the circuit. Transitions of the signals during the simulation are stored into a simulation log file 524. For the result of the execution of the logic simulator 523, evaluation is made by judging whether the simulation has terminated normally (step 525). Unless it terminated normally, modify the simulation patterns 521 and/or logic circuit data 522. Next, in a step for sampling the signals and incrementing the counters 526, using the simulation log file 524 as input, measurements are made to determine what combination of signals has been executed. Specifically, in synchronization with the rising edge of every clock signal, the logic values of the signals of interest are sampled. Checking is made for correspondence between a combination of sampled signals and a branch in the state machine 513. If matching therebetween occurs, transition to a node to which the branch goes takes place and the count value existing in the combination appearance count field 5191 of the counter associated with the branch is incremented by one. The next transition branch in the state machine 513 is compared with the next combination of sampled signals. After incrementing the count value in the combination appearance count field 5191, if the next combination of sampled signals do not match with any branch corresponding to a combination of signals, it is judged that contravention of the specifications occurs at this stage (step 527). Then, modify the simulation patterns 521 and/or logic circuit data 522. When sampling and check have been completed up to the simulation end time, it is meant that the checked simulation patterns fall within the permissible range of the specifications.

It is also possible to further input different simulation patterns 521 to the simulator 523 and, by simulation result thereof, increment the count values in the appropriate combination appearance count fields, obtained from the previous simulation result.

After updating the counters for combinations of signals, a step for extracting the minimum value is execute and the minimum value among the combination appearance counts is stored into a minimum value 532 register. Then, a level determination step 533 determines a level 534 that is stored into a level 534 register. In the level determination step 533, parameter, the number of signals in combination 515 and the minimum value 532 are used in determining a level 534. For example, given that parameter, the number of signals in combination 515 is n and the minimum value 532 is m, a level can be determined such that n–m. What are indicated by the values of n and m are as follows. The greater the value of n, the longer combination has been checked. The greater the value of m, the greater will be the number of times the same combination has been checked. If m is 0, it indicates that some of the possible combinations of n signals are not checked by simulation. While bugs cannot be found in the executed simulation patterns, there is a possibility of bugs being detected regarding the specifications for the combinations of signals that have not yet appeared. If the minimum value is an integer n, not 0, with regard to the specifications for the combinations of signals that only appeared by n times, there is a possibility of bugs being detected when further simulation is executed more than n times.

Figure 7:
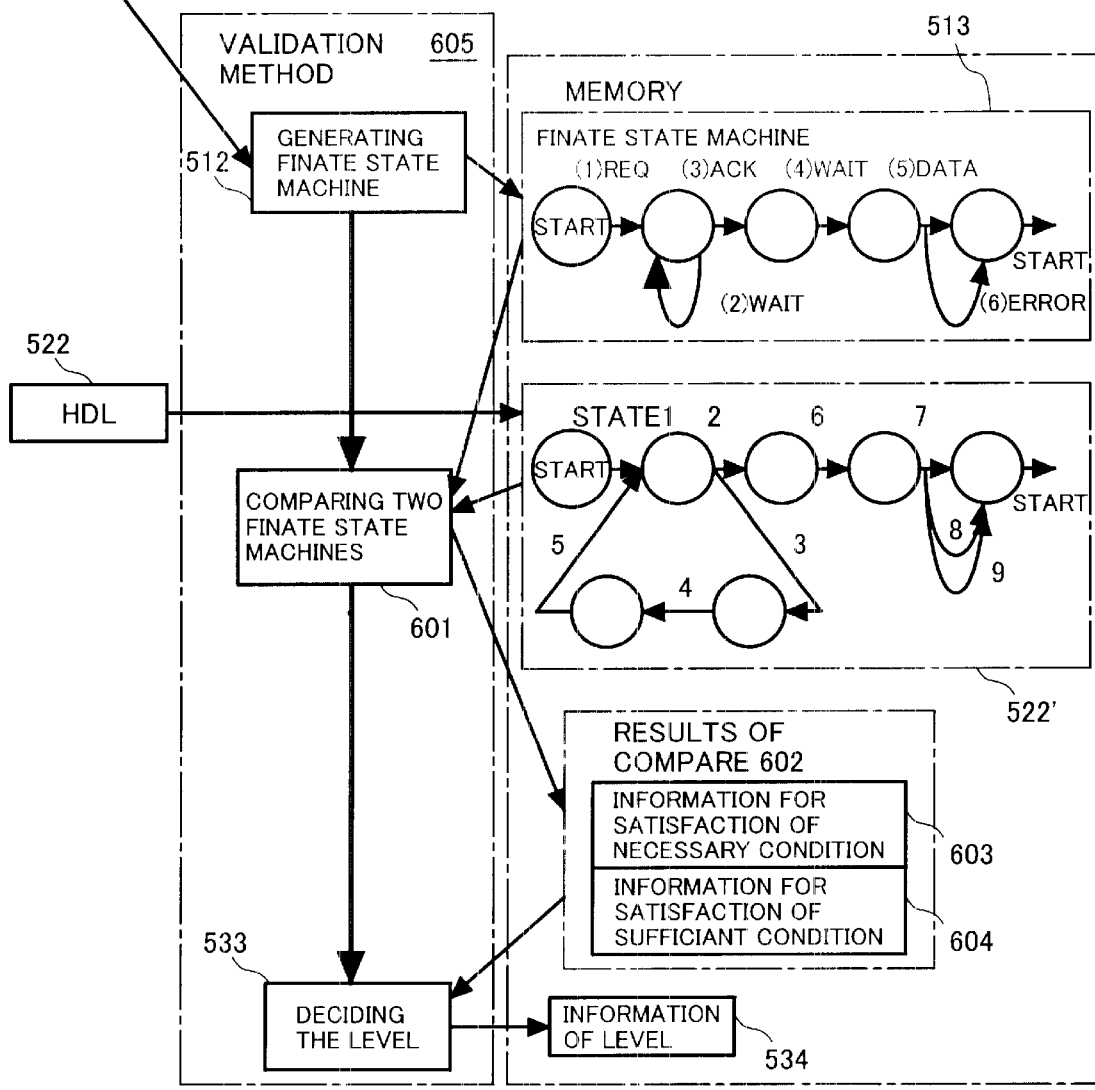
FIG. 7 is a diagram for explaining a comparison method using a validation level determination program and a formal verification method.

With reference to FIG. 7, a comparison method using the validation level determination program 605 and a formal verification method will now be explained. If logic circuit data 522 described in HDL or the like can be developed into a state machine 522' representation, the state machine 522' of the logic circuit data 522 and the state machine 513 representing the electronic specifications 104 are compared in graphic structure and matching between both can be verified. In a step for comparing the two state machines 601, both graphs are compared in the following generally known procedure.

First, determine which of the two graphs is used as reference. For all transition branches from the origin of the reference graph, check to see whether corresponding transition branches exist from the origin of the other graph. For the case illustrated in FIG. 7, for example, assume that the state machine 513 is set for reference and the state machine 522' is compared with it. For the first branch (1) req in the state machine 513, which represents a transition in which the signal value at the rq pin changes to high, check state 1 in the state machine 522' to see whether the signal value at the rq pin changes to high. Similarly, check the values of all signals appeared at the same timing as for (1) req. If the corresponding change is found to occur for all signals in state 1, it becomes evident that an inclusion relation exists between the reference graph and the other graph for (1) req. If the corresponding change is not found, there is a mismatch between both graphs. After the correspondence between the first transitions in both graphs is made ascertain, the process goes to comparison between the next state transitions in the graphs. In the illustrative case in FIG. 7, checking is made for transitions from the next node following the (1) req transition and the next node following the state 1 transition. In the same way as in comparing (1) req and state 1, next, compare (2) wait and state 3 and (3) ack and state 2. After comparing all corresponding transitions in the graphs in this way, if no mismatch between both graphs is found, it becomes evident that transitions corresponding to all transitions in the reference graph are present in the other graph. In other words, the reference graph is completely included in the other graph. If the state machine 513 of electronic specifications 104 is set for reference, it can be confirmed that circuit operations corresponding to all specifications exist definitely. Inversely, if the state machine 513' of logic circuit data 522 is set for reference, it can be confirmed that specifications corresponding to all circuit operations exist. The result of the above-described comparison is stored into a result of compare 602 register. What is stored into this register as the result of comparison when the state machine 513 of electronic specifications 104 is set for reference is information indicating whether to satisfy necessary conditions 603. What is stored into this register as the result of comparison when the state machine 522' of logic circuit data 522 is set for reference is information indicating whether to satisfy sufficient conditions 604.

Based on the above information, the level determination step 533 determines a level 534. For example, if "comparison matching" is stored into one part of the register for the information indicating whether to satisfy necessary conditions 603, the level determination step 533 outputs "level 2" to the level 534 register. If "comparison matching" is stored into the other part of the register for the information indicating whether to satisfy sufficient conditions 604, the level determination step outputs "level 3" to the level 534 register. If "comparison matching" is stored into both the parts of the register for both of information 603 and 604, the level determination step outputs "level 4." As explained with the above examples, what extent or degree to which both graphs are matching is stored into the level 534 register.

Figure 8:
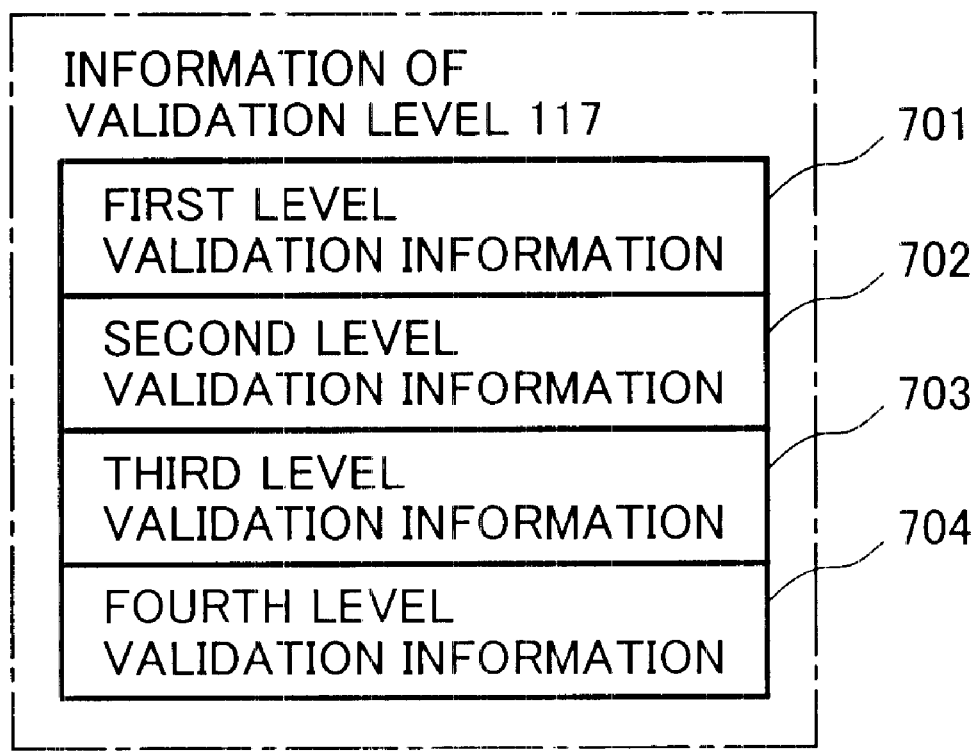
FIG. 8 illustrates exemplary validation level information that is generated in the present invention.

FIG. 8 illustrates exemplary validation level information to be stored into the level register. The validation level information 117 includes first level validation information 701 to be stored that corresponds to the level 534 determined in the procedure illustrated in FIG. 5, that is, the level information as to how many combinations of signals for which simulation has been performed and how many times simulation has been performed for each combination. Whether simulation has been performed is checked for each combination of values of signals appearing at the pins at a sampling time or sequence of signal changes regarding a function that the IP provides. In addition, the validation level information includes second level validation information 702 to be stored that corresponds to the information indicating whether to satisfy necessary conditions 603 illustrated in FIG. 7, that is, the level information as to whether the requirements of the specifications are fulfilled by the operations to take place in the logic circuit. The validation level information further includes third level validation information 703 to be stored that corresponds to the information indicating whether to satisfy sufficient conditions 604 illustrated in FIG. 7, that is, the level information as to whether all possible operations in the logic circuit are covered by the specifications. The validation level information further includes fourth level validation information 704 to be stored that reflects both the information indicating whether to satisfy necessary conditions 603 and the information indicating whether to satisfy sufficient conditions 604, that is, the level information as to whether the requirements of the specifications and the actual operations in the logic circuit match.

The first level validation information indicates the range or coverage of simulation. In this embodiment, the higher the level, the wider will be the verification range. For the second, third, and fourth level validation information 702 to 704, the higher the level, the wider will be verification range. In this embodiment, if the fourth level validation level information 704 indicates "matching," it is meant that the specifications and the logical circuit completely agree.

Figure 9:
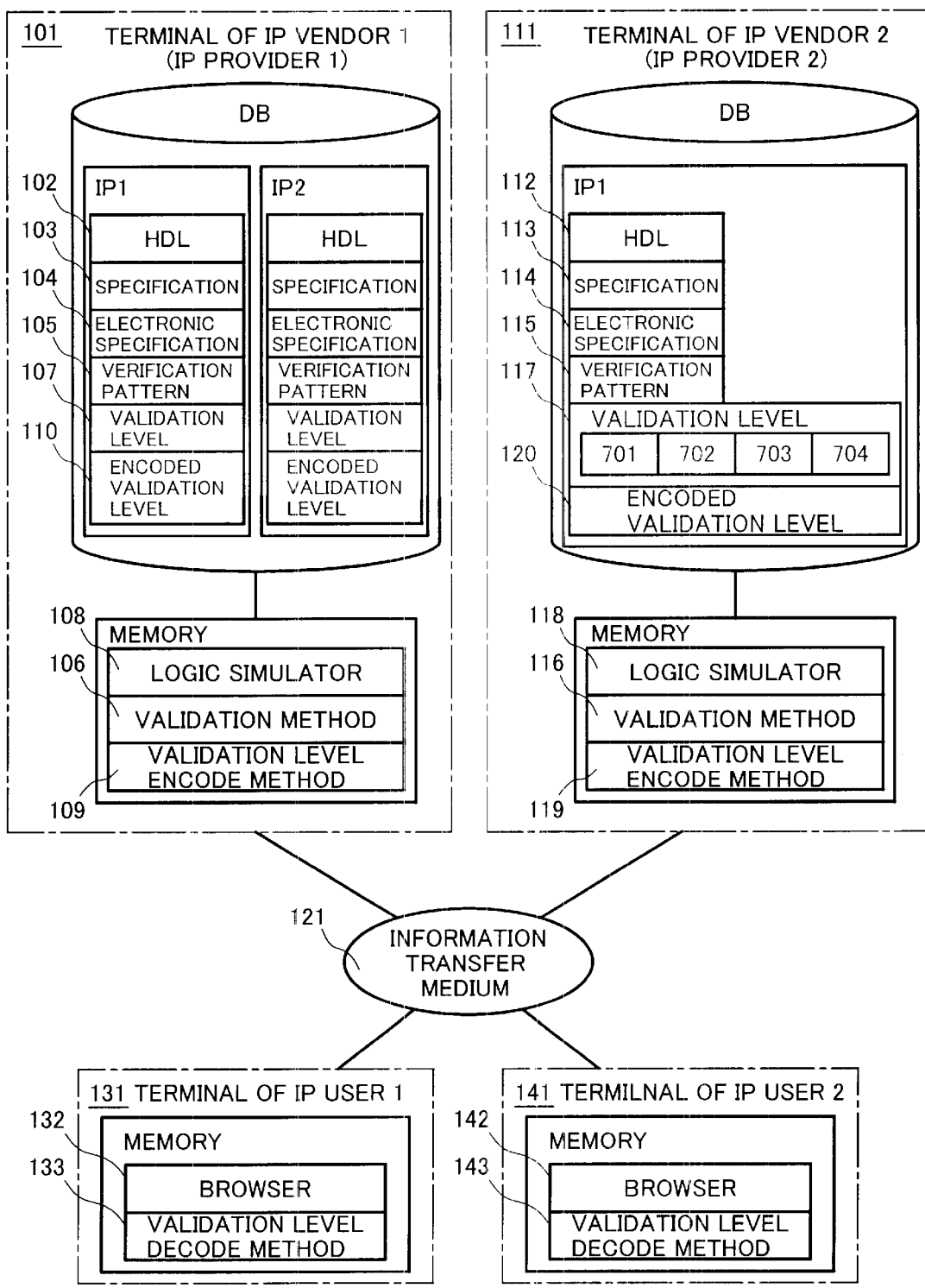
FIG. 9 illustrates an example of arranging for sets of information in which validation level information is added to the information to be provided to users in the present invention.

FIG. 9 illustrates an example of arranging for sets of information in which validation level information is added to the information to be provided to users in the present invention. From this drawing, it swill be easily appreciated by contrast with FIG. 2 that validation level information examples 701 to 704 illustrated in FIG. 8 are added as validation level 117 information for IP1 released on the IP vendor's terminal 111.

Figure 10:
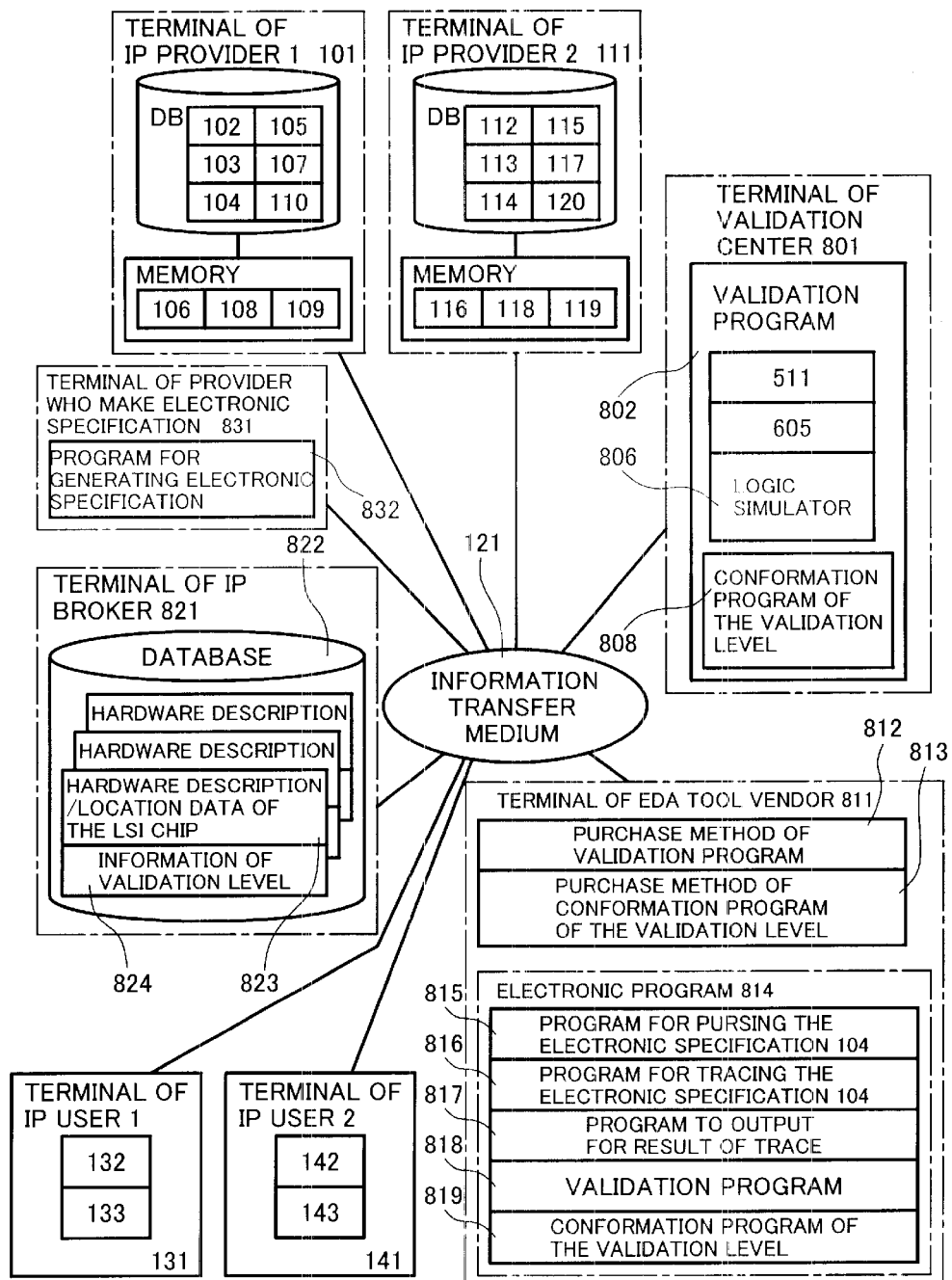
FIG. 10 is a schematic diagram for explaining IP distribution channels as another preferred embodiment of the present invention.

FIG. 10 is provided for explaining IP distribution channels as another preferred embodiment of the present invention. In FIG. 10, the same reference numbers as in the preceding drawings designate the same entities or the entities serving the same function.

Determining a validation level can be executed on a validation center terminal 801 of a third party as well as on the IP vendors' terminals. In storage of the terminal 801, a validation level determination program 802 and a validation level authentication program 808 for ensuring that a validation level is true when an IP user requests to confirm the validation level are stored. The validation level determination program 802 to be stored is the same as exemplified in FIGS. 5 and 7. The third party evaluates an IP to be provided by an IP vendor and determines its validation level. In this case, the validation center 801 on behalf of the third party charges the designer of the IP a fee for validation. It is reasonable that, when the validation center has authenticated a validation level by request from an IP user, it charges the designer a fee for authentication.

Software that is used on the IP vendors' terminals and the validation center, such as, for example, the authentication level determination program 802 and validation level authentication program 808 can be created on an EDA tool vendor's terminal 811. The EDA tool vendor's terminal 811 has software tools 814 such as a program 815 for parsing electronic specifications 104, a program 816 for tracing electronic specifications 104, and a program 817 to output the result of trace. In addition, the EDA tool vendor's terminal has a validation level determination program 818 and a validation level authentication program 819 that are created by using any of the above programs 815, 816, and 817. Furthermore, the EDA tool vendor's terminal includes means for selling the validation level determination program 812 and means for selling the validation level authentication program 813 as program means for selling these programs. The EDA tool vendor can sell any content out of the software tools 814 to third parties such as the validation center 801, IP vendors 101, 111, and IP users 141, 141 and charge them for the sold content.

On an IP broker's terminal 821, it is preferable to store a list of IPs possessed and provided by one ore more IP vendors and IP-specific validation level information or implementation products of the IPs into its memory. In storage of the terminal 821, a database 822 exists for storing information 823 locating the hardware descriptions or the implementation products (LSI chips) of IPs and validation level information 824 for each IP. The IP broker can render the contents of the database 822 open to IP users and charge them a fee for releasing information. The IP broker can charge the IP vendors for a fee for providing information on behalf of the vendors. When content from an IP vendor is sold to an IP user, the IP broker can charge the IP vendor and the IP user a brokerage fee.

An IP vendor may outsource the work of creating electronic specifications 104 in normalized or graphic representation to be stored into any storage to a third party, a contractor for making electronic specifications. In storage of a terminal 831 of the contractor for making electronic specifications, programs for generating electronic specifications 104 are stored. The above contractor can charge the IP vendor for the undertaken work of creating electronic specifications 104.

According to the present invention, a range of verification executed for IP can be determined in degrees. By comparing IPs, according to this range information, IP users will quickly find and easily obtain a high-quality IP.

The present invention enables an IP vendor to push their proprietary IP for having a higher degree of verification range than the IPs of other competitive vendors. IP vendors can push their own IPs in distinction from other corporate ones and this can lead to increasing sales volume of their IPs.

What is claimed is:

1. A method for validating an intellectual property (IP) of an LSI design asset, said method comprising:

generating hardware descriptions of an IP to be provided to users, a state machine that is normalized or graphic representation of electronic specifications described in normalized or graphic representation, based on the hardware descriptions, a logic simulator for verifying the operations of the IP implementation circuit built, based on the hardware descriptions of the IP, and simulation patterns;

setting parameter, the number of signals in combination for a combination of values of signals appearing at all pins at a sampling time, said combination being associated with a branch of said state machine;

executing said simulation patterns by said logic simulator, according to the set parameter, the number of signals in combination; and obtaining an IP validation level from said parameter, the number of signals in combination;

wherein, the thus obtained IP validation level information is added to the IP information to be provided to users.

2. An integrated circuit module of IP implementation that is an article of trade and shipment to which IP validation level information obtained by the method claimed in claim 1 is added.

3. A method for validating an intellectual property (IP) of an LSI design asset according to claim 1, wherein objects and a combination thereof to be measured for simulation coverage determination by using said simulation patterns are automatically extracted from said state machine.

4. A method for distributing an intellectual property (IP) of an LSI design asset, comprising:

encrypting said validation level obtained by the method claimed in claim 1 by validation level encrypting program means; and decrypting the thus encrypted validation level by validation level decrypting program means, thereby making it possible to confirm that said validation level is true.

5. A method for distributing an intellectual property (IP) of an LSI design asset, comprising:

encrypting said validation level obtained by the method claimed in claim 3 by validation level encrypting program means; and decrypting the thus encrypted validation level by validation level decrypting program means, thereby confirming that said validation level is true.

6. A method for trading intellectual properties (IPs) of LSI design assets, whereby the IPs are generated by performing the following steps:

generating hardware descriptions of an IP to be provided to users, a state machine that is normalized or graphic representation of electronic specifications described in normalized or graphic representation, based on the hardware descriptions, a logic simulator for verifying the operations of the IP implementation circuit built, based on the hardware descriptions of the IP, and simulation patterns;

setting parameter, the number of signals in combination for a combination of values of signals appearing at all pins at a sampling time, said combination being associated with a branch of said state machine;

executing said simulation patterns by said logic simulator, according to the set parameter, the number of signals in combination; and obtaining an IP validation level from said parameter, the number of signals in combination;

wherein the thus generated IPs are traded via a system in which IP vendors that can supply IPs and users who may buy said IPs are connected by an information transfer medium.

7. A method for trading intellectual properties (IPs) of LSI design assets according to claim 5, said method including:

encrypting said validation level by validation level encrypting program means; and decrypting the thus encrypted validation level by validation level decrypting program means, thereby confirming that said validation level is true, before trading the IPs can be carried out.

* * * * *